US009350362B2

(12) United States Patent
Walraven

(10) Patent No.: US 9,350,362 B2
(45) Date of Patent: May 24, 2016

(54) PROGRAMMABLE SLEW RATE PHASE LOCKED LOOP

(71) Applicant: Thomas & Betts International, LLC, Wilmington, DE (US)

(72) Inventor: Justin Walraven, San Diego, CA (US)

(73) Assignee: Thomas & Betts International, LLC, Wilmington, DE (US)

( * ) Notice: Subject to any disclaimer, the term of this patent is extended or adjusted under 35 U.S.C. 154(b) by 4 days.

(21) Appl. No.: 14/486,233

(22) Filed: Sep. 15, 2014

(65) Prior Publication Data

US 2015/0097602 A1   Apr. 9, 2015

Related U.S. Application Data

(60) Provisional application No. 61/888,150, filed on Oct. 8, 2013.

(51) Int. Cl.
| H03L 7/00 | (2006.01) |
| H03L 7/08 | (2006.01) |
| H03L 7/095 | (2006.01) |
| H02J 9/06 | (2006.01) |
| H03L 7/07 | (2006.01) |

(52) U.S. Cl.
CPC .............. *H03L 7/0805* (2013.01); *H02J 9/062* (2013.01); *H03L 7/07* (2013.01); *H03L 7/095* (2013.01); *H02J 2009/068* (2013.01); *H03L 2207/14* (2013.01)

(58) Field of Classification Search
CPC .................. H01L 2924/00; H01L 2924/0002; H03L 7/10; H03L 7/23
See application file for complete search history.

(56) References Cited

U.S. PATENT DOCUMENTS

| 5,473,533 A | 12/1995 | Mengelt |
| 5,541,959 A | 7/1996 | Myers |
| 6,163,687 A | 12/2000 | Scott et al. |
| 7,288,958 B2 | 10/2007 | Takagi |

(Continued)

FOREIGN PATENT DOCUMENTS

EP     1229653 A1    8/2002

OTHER PUBLICATIONS

Gutor Technical Data Sheet, PxW AC UPS System, retrieved Sep. 15, 2014, from Schneider Electric: www.schneider-electric.com, 4 pages.

(Continued)

*Primary Examiner* — Sibin Chen
(74) *Attorney, Agent, or Firm* — Snyder, Clark, Lesch & Chung, LLP

(57) ABSTRACT

A system includes a first phase-locked loop (PLL) circuit, a slew rate limiter and a second PLL. The first PLL is configured to receive an input signal, generate a first output identifying a frequency associated with the input signal, and generate a second output identifying phase information associated with the input signal. The slew rate limiter is configured to receive the first output from the first PLL, determine whether the frequency of the first output is changing at greater than a predetermined rate, and generate a first signal indicating whether the frequency is changing at greater than the predetermined rate. The second PLL is configured to receive the first signal from the slew rate limiter, receive the second output from the first PLL, and generate an output signal identifying an angle or phase information based on the first signal and the second output.

20 Claims, 6 Drawing Sheets

(56) References Cited

U.S. PATENT DOCUMENTS

| | | |
|---|---|---|
| 7,376,158 B2 | 5/2008 | Woodward, Jr. |
| 7,493,095 B2 | 2/2009 | Chuang et al. |
| 7,576,576 B2 | 8/2009 | Drexler et al. |
| 7,602,253 B2 | 10/2009 | Kim et al. |
| 7,881,413 B2 | 2/2011 | Nichols |
| 8,093,930 B2 | 1/2012 | Qiao |
| 8,154,329 B2 | 4/2012 | Ecklund et al. |
| 2004/0063414 A1 | 4/2004 | Kasperkovitz |
| 2005/0273751 A1* | 12/2005 | Dalton ............... G06F 17/5063 716/104 |
| 2006/0001494 A1 | 1/2006 | Garlepp et al. |
| 2008/0218278 A1 | 9/2008 | Sundby |
| 2012/0313677 A1 | 12/2012 | Thomas |
| 2014/0062605 A1* | 3/2014 | Stengel ................ H03L 7/099 331/34 |

OTHER PUBLICATIONS

Ametek DPP—Digital Process Power UPS Data Sheet for Single Phase DPP, retrieved Sep. 15, 2014, from Ametek Solidstate Controls: www.solidstatecontrolsinc.com, 5 pages.

Ametek DPP—Digital Process Power UPS Data Sheet for Three Phase DPP, retrieved Sep. 15, 2014, from Ametek Solidstate Controls: www.solidstatecontrolsinc.com, 5 pages.

\* cited by examiner

PROGRAMMABLE SLEW RATE PHASE LOCKED LOOP

RELATED APPLICATION

This application claims priority under 35 U.S.C. §119 based on U.S. Provisional Patent Application No. 61/888,150, filed Oct. 8, 2013, the disclosure of which is hereby incorporated herein by reference.

BACKGROUND INFORMATION

A phase-locked loop (PLL) circuit or system generates an output signal whose phase is related to the phase of an input signal. Conventional systems that include PLLs often include a control filter that sets the bandwidth at which the PLL circuit will follow changes in frequency of the input signal.

One drawback with using such PLLs is that the rate of change of the frequency (referred to as the slew rate) is not precisely specified. That is, the slew rate is only roughly set since the relationship between the slew rate and the bandwidth of the control filter is not linear. Another drawback with using such PLLs is that the slew rate is typically a "soft" limit and not a hard limit. As a result, even if the average slew rate over a period of time is equal to the desired slew rate over the period of time, there will typically be instants in time in which the slew rate will be higher than the desired slew rate and instants in time in which the slew rate will be lower than the desired slew rate.

DETAILED DESCRIPTION OF PREFERRED EMBODIMENTS

The following detailed description refers to the accompanying drawings. The same reference numbers in different drawings may identify the same or similar elements. Also, the following detailed description does not limit the invention.

Embodiments described herein provide a slew rate limited phase locked loop system/circuit that may be programmable. In one implementation, a first PLL receives a normalized input signal and outputs a frequency signal to a slew rate limiter. The slew rate limiter determines if the frequency is changing at greater than a maximum slew rate and if not, the slew rate limiter generates a lock indication signal. A second PLL receives the lock indication signal and generates output angle information based on the output from the first PLL when the lock indication signal is active. The output angle information may be provided to another system. In one implementation, when the lock indication is active for a predetermined amount of time, the output angle information may be used by the other system to perform a control action. For example, the other system may use the angle information and lock indication to provide an output that is synchronized with (e.g., follows the phase) the output angle.

Figure 1:
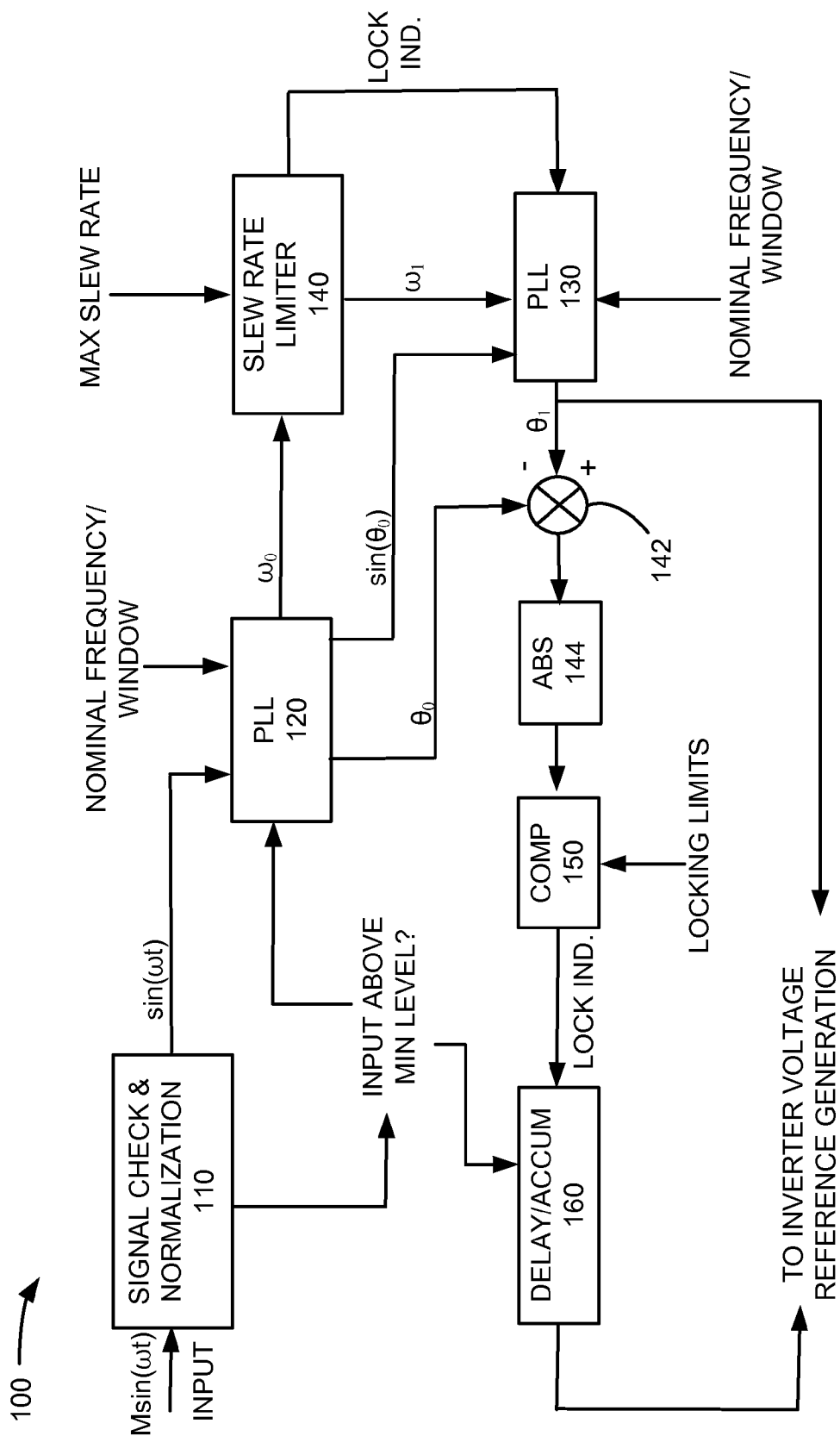
FIG. 1 is an overall block diagram of a programmable phased locked loop system consistent with an exemplary embodiment.

FIG. 1 is a block diagram of a programmable slew rate phase-locked loop (PLL) system 100 in accordance with an exemplary implementation. Referring to FIG. 1, system 100 includes signal check and normalization block 110, PLL 120, PLL 130, slew rate limiter 140, summer 142, absolute value block 144, comparison block 150 and delay accumulate block 160. The exemplary configuration illustrated in FIG. 1 is provided for simplicity. It should be understood that system 100 may include more or fewer components than illustrated in FIG. 1. System 100 may operate to control the slew rate of an output based on an input.

For example, in a double-conversion uninterruptible power supply (UPS) system with an alternate power source (e.g., a generator), the inverter or standard output of the UPS system must follow the phase of the alternate power source (e.g., be synchronized with the alternate power source) in case the static switch of the UPS system must change the output from the inverter to the alternate power source. However, if the alternate power source/line has low quality voltage and/or voltage that changes frequency rapidly, it is not desirable for the inverter of the UPS system to follow the phase of the alternate power source closely, since this would result in the output of the inverter having low quality voltage or other problems. Therefore, system 100 operates to have a maximum rate of change so that under normal circumstances, the inverter of the UPS system (not shown in FIG. 1) follows the phase of the alternate power source, but under transient conditions when the voltage of the alternate power source is changing rapidly or when the voltage quality of the alternate power source is low, the inverter does not follow the phase of the alternate power source. When the frequency of the alternate power source stops changing rapidly and the level of the signal meets a minimum threshold, the inverter will follow the phase of the alternate power source, as described in detail below.

Signal check and normalization block 110 operates to determine whether an input signal meets a minimum threshold value (e.g., a minimum voltage level). For example, signal check and normalization block 110 determines whether the voltage level of a signal is above a lower limit. In an exemplary implementation, the input signal represents a voltage signal associated with an alternate power source that is input to a UPS system. In other implementations, the input signal represents other types of input signals that may be tracked. The particular minimum threshold value/lower limit associated with the input signal is based on the particular embodiment in which system 100 is used.

Signal check and normalization block 110 also operates to normalize the received input signal to a predetermined level. For example, signal check and normalization block 110 may receive a sinusoidal input signal represented as $M \sin(\omega t)$, as illustrated in FIG. 1, where M represents the magnitude of the sinusoidal input, and outputs a signal represented by $\sin(\omega t)$. In an exemplary implementation, the input signal represents a voltage associated with the alternate power supply line. In this case, signal check and normalization block 110 normalizes the input signal to a unity gain (e.g., a sinusoidal wave ranging in amplitude from −1 to 1).

Figure 2:
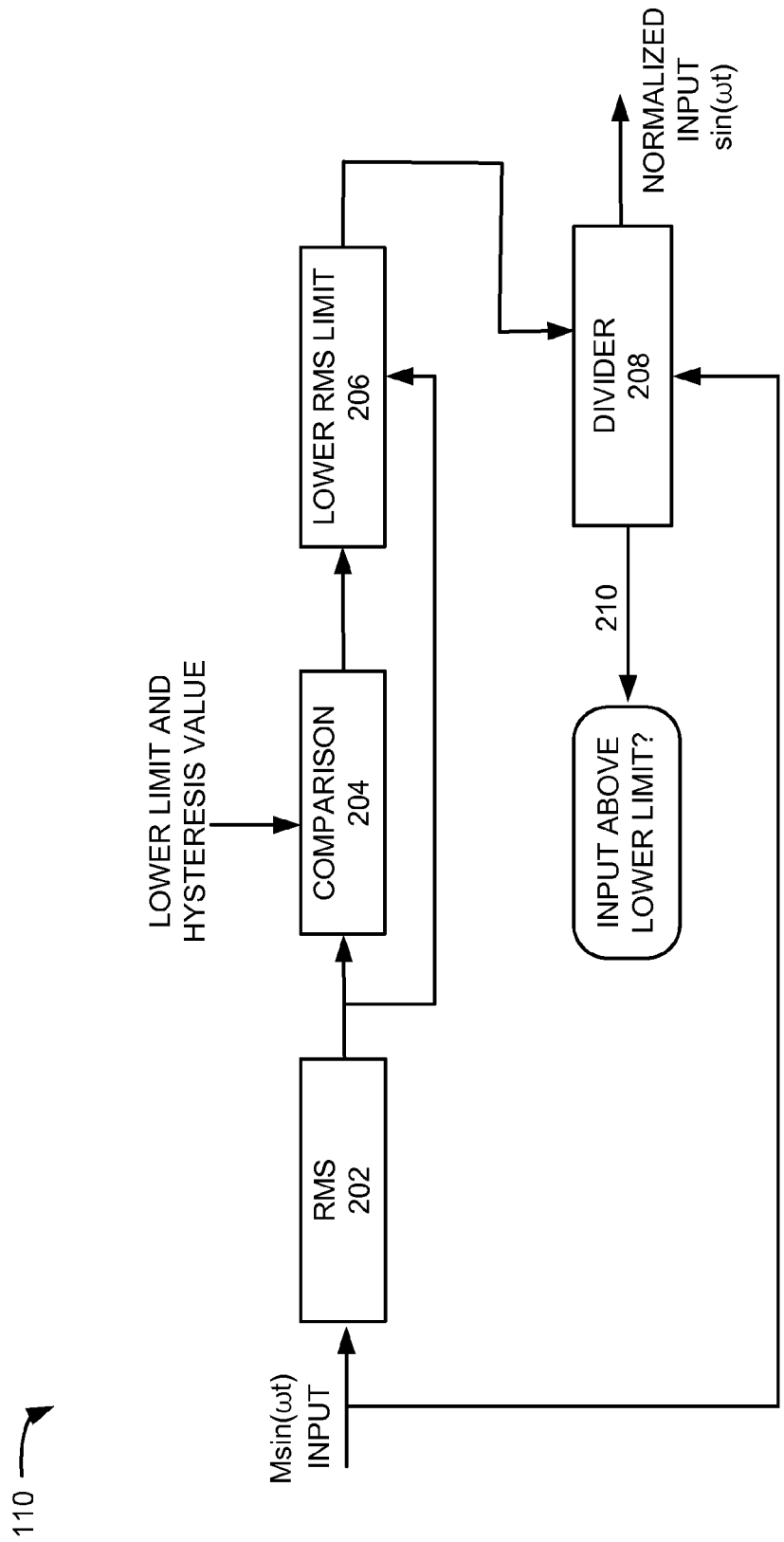
FIG. 2 is a block diagram of the signal check and normalization block of FIG. 1 consistent with an exemplary implementation.

FIG. 2 illustrates an exemplary implementation of signal check and normalization block 110. As illustrated in FIG. 2, signal check and normalization block 110 includes root mean square (RMS) block 202, comparison block 204, lower RMS limit block 206 and divider block 208. As illustrated in FIG. 2 and discussed above with respect to FIG. 1, the input signal may be a sinusoidal input represented by M sin(ωt), where M represents the magnitude of the sinusoidal input. RMS block 202 receives the input signal and calculates the RMS value of the input signal. For example, RMS block 202 may calculate the square root of the arithmetic mean (i.e., average) of the squares of the function that defines the continuous input signal/waveform (i.e., M sin(ωt)). Comparison block 204 compares the RMS value output by RMS block 202 to a lower limit and hysteresis value to determine whether the RMS value is above the lower limit/threshold value.

Figure 3:
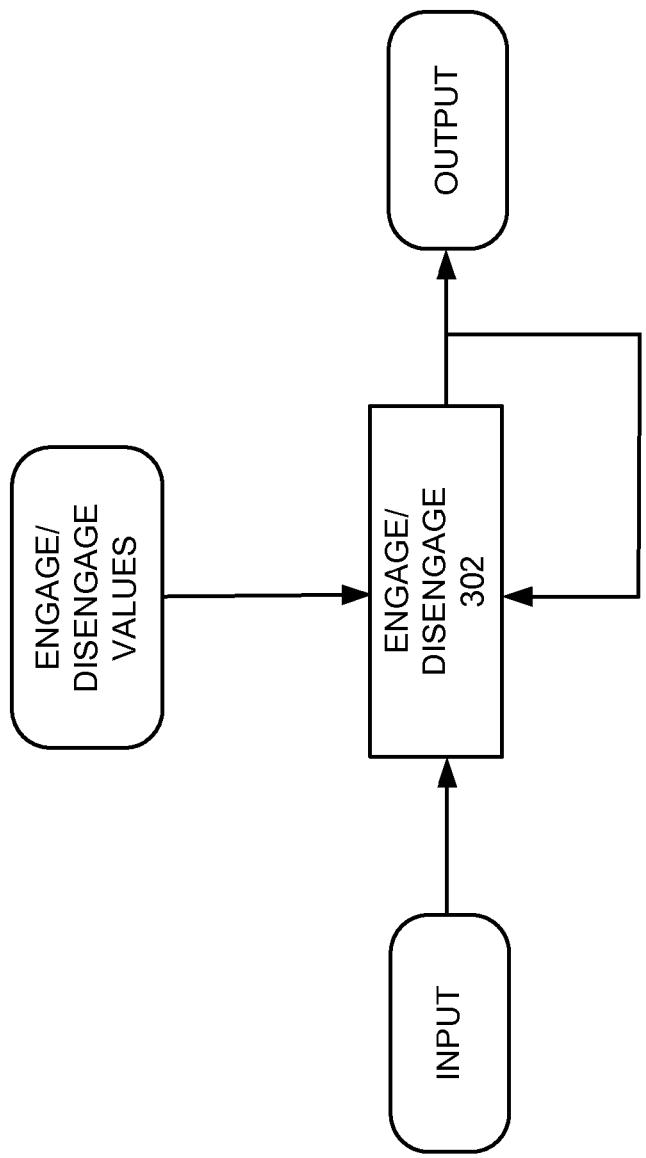
FIG. 3 is a block diagram of the comparison block of FIG. 2 consistent with an exemplary implementation.

For example, FIG. 3 illustrates a schematic representation of comparison block 204. Referring to FIG. 3, comparison block 204 includes engage/disengage block 302. Engage/disengage block 302 receives the engage/disengage value, which corresponds to the lower threshold of the input signal. That is, the engage/disengage value corresponds to a lower limit below which, the input signal is not of sufficient level to be used. Engage/disengage block 302 also receives the input signal (e.g., M sin(ωt)), compares the input signal to the threshold value and outputs a signal having a Boolean value indicating whether the input signal is above the threshold value. Engage/disengage block 302 also receives feedback representing the current output of engage/disengage block 302 to prevent "chattering" or rapid toggling of the output signal. For example, engage/disengage block 302 may output a disengage value (e.g., a "0") even when the input is above the threshold value if the input is rapidly changing from a value above the lower limit to a value below the lower limit. If the output is above the lower limit and the output is not toggling/changing rapidly, engage/disengage block 302 may output an engage value (e.g., a "1").

Referring back to FIG. 2, comparison block 204 outputs the determination of the comparison to lower RMS limit block 206 which forwards the signal to divider block 208. Lower RMS limit block 206 also forwards the magnitude of the input signal to divider block 208. Divider block 208 normalizes the input signal. For example, divider block 208 may divide the magnitude of the signal by the RMS value calculated by RMS block 202 times the square root of two to normalize the input signal. In one implementation, divider block 208 normalizes the signal to have a unity gain, represented as sin(ωt), as discussed above with respect to FIG. 1. Divider block 208 may also output a Boolean signal 210 indicating whether the input signal is above the lower limit (also referred to as the minimum level), as illustrated in FIG. 2. For example, a Boolean value of "1" may indicate that the input signal is above the lower limit/threshold and a Boolean value of "0" may indicate that the signal is not above the lower limit/threshold. PLL 120 uses the Boolean input as an "active" signal, as described below.

Referring back to FIG. 1, PLL 120 receives the normalized signal represented by sin(ωt) and the Boolean signal indicating whether the signal is above the minimum threshold. PLL 120 uses the Boolean signal as the "active" signal. That is, when PLL 120 receives a "1" from signal check and normalization block 110, PLL 120 may operate in conjunction with slew rate limiter 140 and PLL 2, as described below. When the Boolean value is "0" indicating that the input signal is below the user set minimum level, PLL 120 outputs the nominal frequency as the output frequency, which effectively turns PLL 120 into a free running ramp from zero to 2π at the nominal frequency. When the input signal rises above the minimum level (i.e., the Boolean value is "1"), PLL 120 returns to tracking the input signal, as described below.

Figure 4:
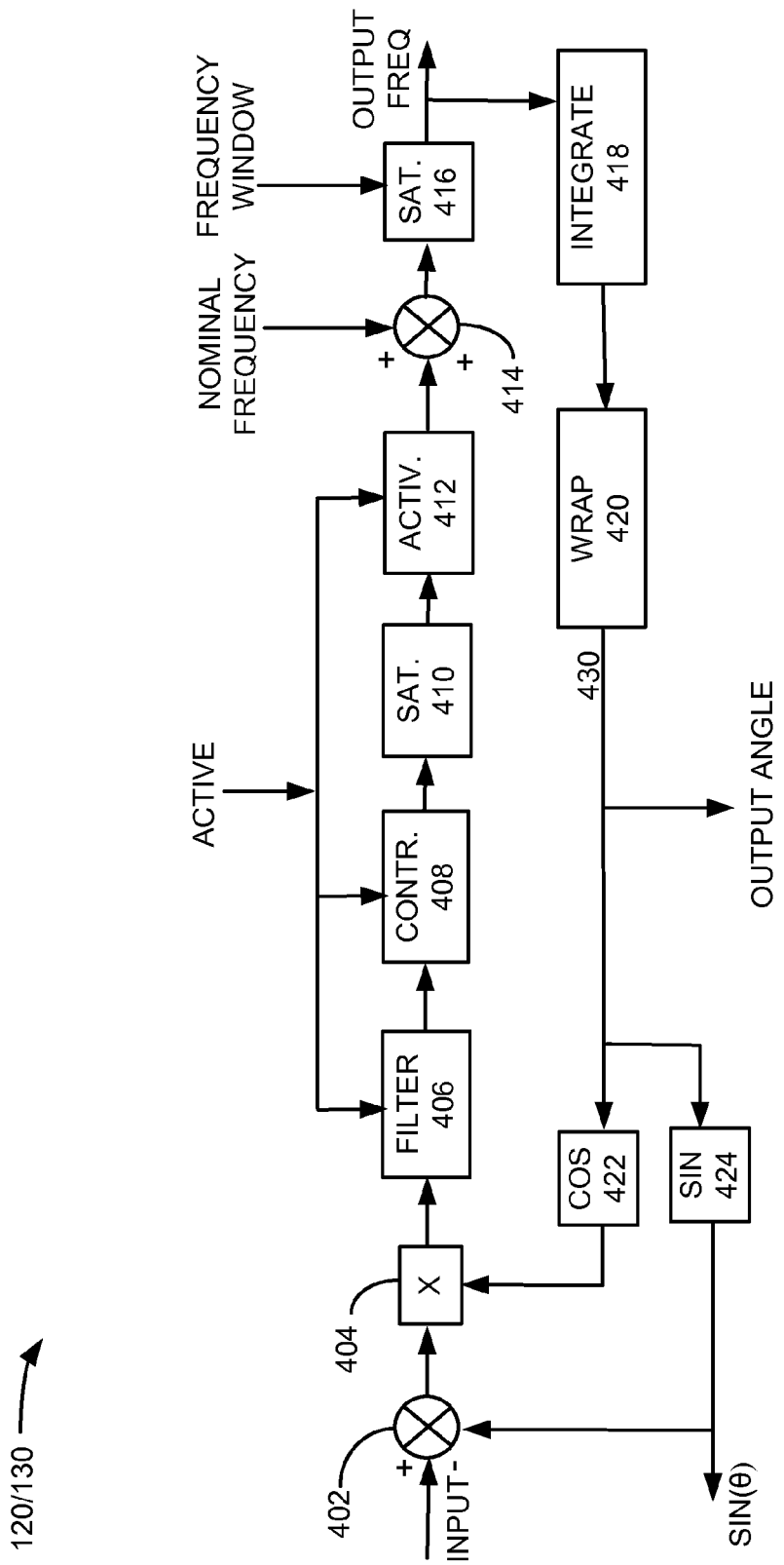
FIG. 4 is a block diagram of an exemplary PLL that may be used in connection with the PLL blocks of FIG. 1 consistent with an exemplary implementation.

FIG. 4 illustrates PLL 120 (and PLL 130) according to an exemplary implementation. Referring to FIG. 4, PLL 120 (and PLL 130) includes summing block 402, multiplier block 404, filter 406 (also referred to as filter block 406), controller 408 (also referred to as controller block 408), saturation block 410, activation block 412, summing block 414, saturation block 416, integration block 418, wrap block 420, cosine block 422 and sine block 424. In one implementation, PLL 120 has a high bandwidth and the ability to track the input signal through very fast transients. In addition, PLL 130 may have a lower bandwidth and may be slower than PLL 120. PLL 130 may operate to follow the phase output by PLL 120 when the frequency of the output of PLL 120 is not changing at greater than the programmable slew rate, as described in more detail below.

PLL 120/130 functions similarly to conventional PLLs with the addition of a nominal frequency into the PLL, the multiplication of the Boolean "active" signal with the error signal and the saturation of both the controller (via saturation block 410) and the output (via saturation block 416).

Summing block 402, multiplier block 404, cosine block 422 and sine block 424 function as a phase detector for PLL 120/130. Blocks 402 and 404 operate to compare two input signals and produce an error or output signal that is proportional to the phase difference between the two signals. Referring to FIG. 4, the input signal (e.g., sin(ωt) for PLL 120) is compared with the output of sine block 424. Sine block 424 generates the sine associated with signal 430, which is fed back from integration block 418 and wrap block 420. Signal 430 identifies the output angle of PLL 120/130, as described in more detail below, and sine block 424 determines the sine of the output angle. The output of summing block 404 is multiplied by the output of cosine block 422. Cosine block 422 operates to generate the cosine of the output angle from signal 430. The output of multiplier block 404 corresponds to an error signal that identifies the phase difference between the input and output signals.

The output of multiplier block 404 is input to filter block 406. According to an exemplary implementation, filter block 406 is a low pass filter that filters out high frequency components of the phase information. For example, filter block 406 may be a fourth order Butterworth filter. The output of filter block 406 is fed to controller block 408.

Controller block 408 may include a proportional integral controller that acts to drive the phase error to zero to make sure that the frequency stays within a preset range. The output of controller block 408 is fed to saturation block 410. Saturation block 410 receives the output from controller block 408 and provides saturation for the output signal to compensate for anti-windup of controller 408's integral term.

The output of saturation block is fed to activation block 412, which multiplies the received signal by the Boolean "active" signal. The "active" signal is also fed to filter 406 and controller 408, where it is multiplied by all memory elements of filter 406 and controller 408 to effectively clear the memory elements if "active" goes to zero. Therefore, when the active signal goes to zero (i.e., the input signal is below the lower limit/threshold), filter 406, saturation block 410 and activation block 412 are all reset.

As further illustrated in FIG. 4, the nominal frequency associated with the system (e.g., 50 Hz, 60 Hz, etc.) is input to summing block 414, along with the output of activation block 412. This separation of the nominal frequency of system 100 from other blocks of system 100 allows system 100 to be used with 50 Hz systems, 60 Hz systems, etc., (e.g., 50 or 60 Hz UPS systems) without changing other elements of PLL 120/

130. As described above, the "active" signal allows for system 100 to be turned into an open-loop angle generator.

Saturation block 416 provides output saturation to ensure that the output frequency of the PLL (e.g., PLL 120 or PLL 130) is bound to the user-set frequency window. For example, PLL 120's anti-windup may be set to +/−3 Hz, and PLL 130's anti-windup may be set to 0.2 Hz. However, it should be understood that other values may be used based on the particular implementation in which system 100 is used.

Figure 5:
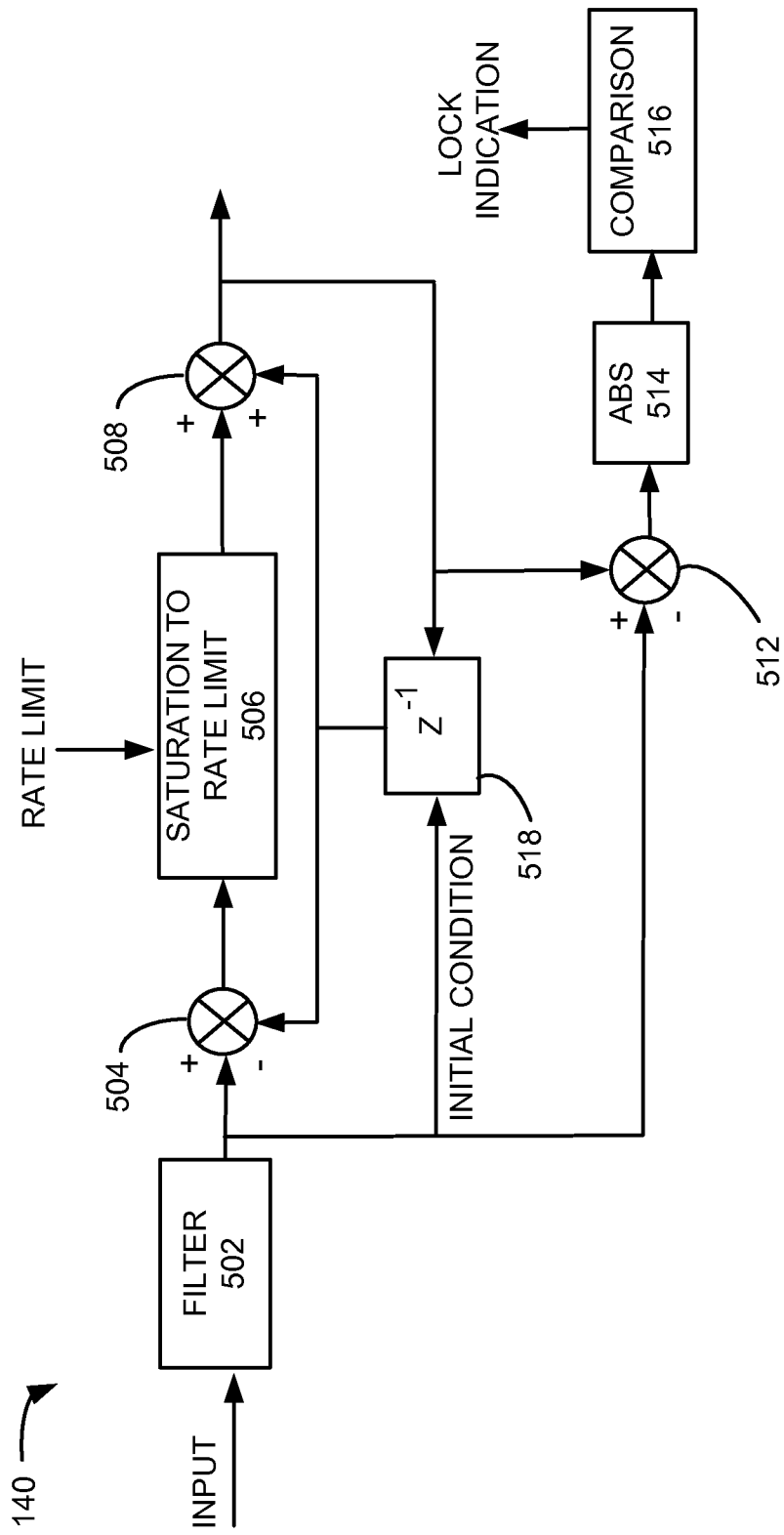
FIG. 5 is a block diagram of the slew rate limiter of FIG. 1 consistent with an exemplary implementation.

Returning to FIG. 1, the output of PLL 120 is input to slew rate limiter 140. Slew rate limiter 140 operates to limit the rate of change of an output signal. For example, FIG. 5 illustrates slew rate limiter 140 in accordance with an exemplary implementation. Referring to FIG. 5, slew rate limiter 140 includes filter 502, summing block 504, saturation to rate limit block 506, summing block 508, summing block 512, absolute value block 514 and comparison block 516.

Slew rate limiter 140 operates as a discrete controller on a sample by sample basis. For example, slew rate limiter 140 may sample frequency information output from PLL 120 at a certain rate (e.g., every 1 second, every 0.25 seconds, every 0.01 seconds, etc.), and identifies changes in frequency based on the samples. As an example, if the maximum slew rate is 1 Hz and the sample rate is every 0.25 seconds, the frequency/slew rate can only change by 0.25 Hz during that 0.25 second interval for the current slew rate to be below the maximum rate. Similarly, if the slew rate is 1 Hz and the sample rate is every 0.01 seconds, the frequency/slew rate can only change by 0.01 Hz during the 0.01 second interval for the current slew rate to be below the maximum rate.

As illustrated, filter block 502 receives the input and filters the input. For example, filter 502 may be a low pass filter that filters out high frequency signals. The output of low pass filter 502 is input to summing block 504. The $Z^{-1}$ block 518 stores the previous value output by slew rate limiter 140, which is input to summing block 504, where it is subtracted from the filtered input to determine the single-cycle rate of change. The output of summing block 504 is forwarded to saturation to rate limit block 506, which also receives the slew rate limit information. The output of $Z^{-1}$ block 518 is also input to summing block 508. As discussed above, the output of summing block 504 is passed to saturation to rate limit block 506 and limited to the maximum single-cycle rate of change. This single-cycle rate of change (of the user-indicated maximum value or less) is then added to the previous output value via summing block 508 to produce the rate-limited output.

The filtered input is also input to summing block 512 along with the output from summing block 508. Summing block 512 determines the difference between the filtered input and the output of summing block 508 and forwards the difference to absolute value block 514, which determines the magnitude/absolute value of the difference. If the absolute value of the difference between the current input and the last output exceeds the slew rate limit, the difference between the current output and the last output will be limited to the rate limit.

However, if the current output and the current input are "close" to each other (e.g., are within a predetermined value of each other), comparison block 516 will indicate that the slew rate is "locked." In an exemplary implementation, the "closeness" value is preset. For example, the locked value may be preset to 0.01 Hz for engagement, and the unlocked value may be preset to 0.1 Hz for disengagement. It should be understood that these values are exemplary only and can be changed based on the particular implementation in which system 100 is used. These values may also be user settable.

Referring back to FIG. 1, PLL 130 receives the lock indication from slew rate limiter 140 as its "active" signal. Therefore, if system 100 is in slew-rate limiting mode (i.e., the frequency of the output of PLL 120 is changing at greater than the maximum slew rate), PLL 130 will take the slew-rate limited frequency ($\omega_1$ in FIG. 1) from slew rate limiter 140 and generate a free-running angle ramp. When slew rate limiter 140 returns to the "locked" mode, PLL 130 returns to tracking PLL 120's angle.

When the slew rate limiter 140 is in the locked mode, PLL 130 outputs the tracked angle, which is integrated and wrapped from 0 to $2\pi$ via integrate block 418 and wrap block 420 (FIG. 4). That is, the output frequency $\omega_1$ is integrated to generate an angle corresponding to the phase angle of the input signal. The output angle represented by $\theta_1$ in FIG. 1 is input to an external system. For example, the output angle $\theta_1$ may be input to an inverter voltage reference generator of a UPS system (not shown in FIG. 1), as described in more detail below.

System 100 also operates to ensure that the input signal is above the lower limit for a predetermined period of time to avoid toggling associated with an external system (e.g., a UPS system). For example, the output of PLL 130 is fed via summer 142 and absolute value block 144 to comparator 150. Summing block 142 (also referred to as summer 412) determines the difference between $\theta_0$ and $\theta_1$ to determine whether the two angles are relatively "close" to each other (e.g., within one degree of each other). Absolute value block 144 may determine the absolute value or magnitude of the difference and forward the magnitude value to comparator 150.

Comparator 150 compares the magnitude representing the difference between the angles output from PLL 120 and PLL 130 to a locking limit. For example, in one implementation, the locking limit may be one degree. It should be understood that in other systems, the locking limit may be greater or less than one degree. If the difference is within the locking limit, comparator 150 outputs a lock indication to delay/accumulate block 160.

Delay/accumulate block 160 determines whether the angle outputs from PLL 120 and PLL 130 are "close" to each other for a predetermined period of time. In one implementation, the predetermined period of time may be 0.25 seconds. However, it should be understood that other predetermined periods of time may be used. Delay/accumulate block 150 also determines whether the input signal is above the predetermined lower limit for the predetermined period of time (e.g., 0.25 seconds). Again, the predetermined period of time with respect to the input signal being above the predetermined level may be different in other implementations.

In each case, delay/accumulate block 160 outputs information the external system (e.g. a UPS system) identifying whether the input signal is above the lower limit, whether PLL 120 and PLL 130 have been locked for a predetermined period of time, and whether both of these conditions have been true for a predetermined period of time. The external system uses this information to perform a control action.

For example, in an implementation in which the external system corresponds to an inverter reference voltage generator and the information from delay/accumulate block 160 indicates that the signal is above the lower limit for the predetermined period of time and PLL 120 and PLL 130 have been locked for the predetermined period of time, the inverter of the UPS system may be configured to follow the phase associated with the alternate power source. This ensures that if the UPS system switches to the alternate power source (e.g., a generator), that the phase of the alternate power source will be synchronized with the previously used standard input power source.

Figure 6:
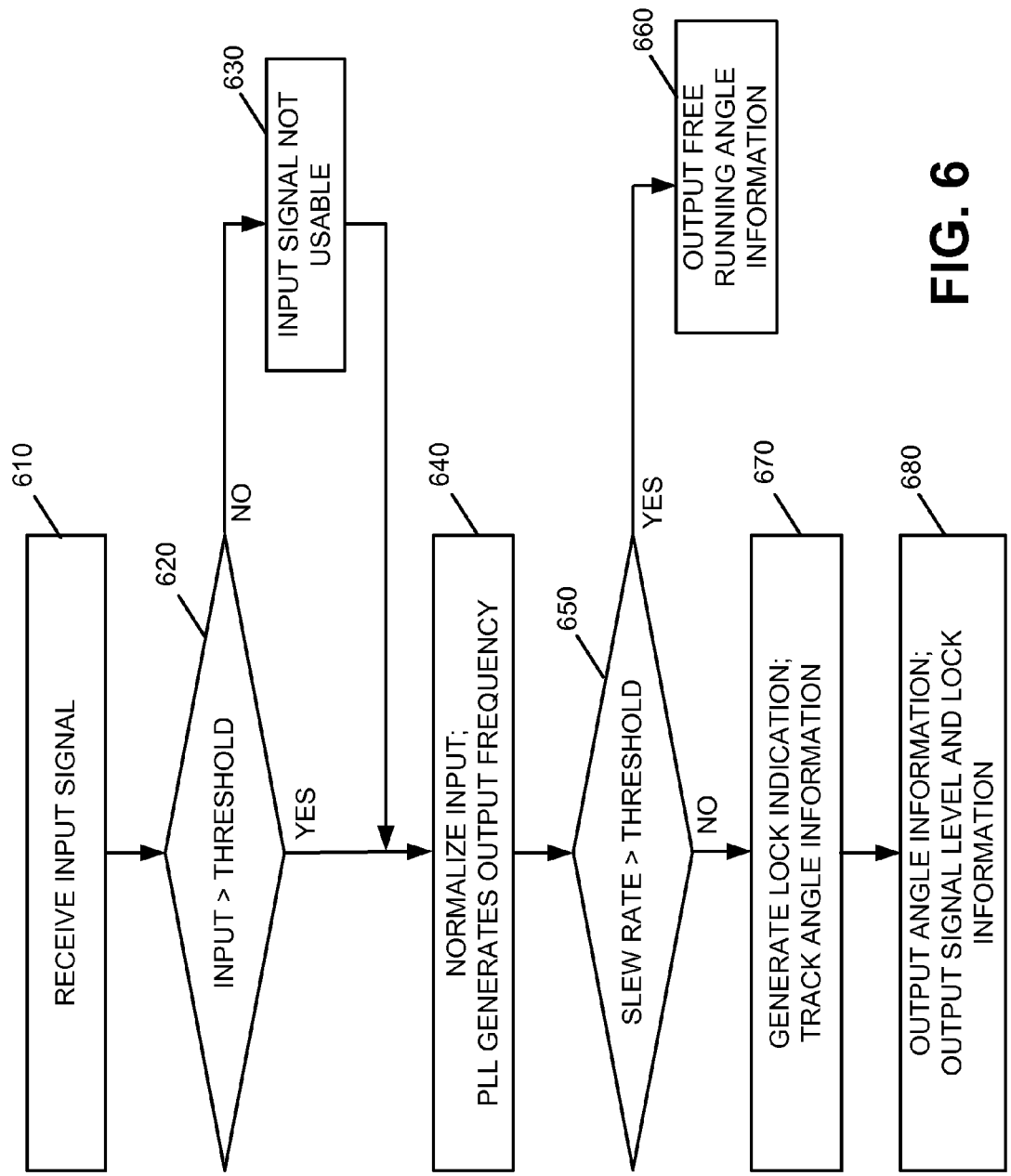
FIG. 6 is a flow diagram illustrating exemplary processing with the system of FIG. 1.

FIG. 6 is a flow diagram illustrating exemplary processing associated with system 100. Processing may begin with system 100 receiving an input signal (block 610). For example, system 100 may receive the input signal represented by M sin(ωt) as discussed above with respect to FIG. 1. Signal check and normalization block 110 may determine if the input signal is above a lower limit/threshold (block 620). If not (block 620—no), this indicates that the input signal is not currently usable (block 630). That is, the quality of the input signal is not of a sufficient level to be tracked. In this case, PLL 120 may output the nominal frequency as the output frequency.

However, if the input signal is above the threshold (block 620—yes), PLL 120 tracks the input signal and generates an output frequency (block 640). For example, PLL 120 may operate as described above with respect to FIGS. 1 and 4 and output a frequency represented by $\omega_0$. Signal check and normalization block 110 also normalizes the input signal to, for example, a unity gain (block 640).

Slew rate limiter 140 receives the output frequency and determines if the slew rate is greater than the maximum slew rate/threshold (block 650). For example, slew rate limiter 140 may operate as discussed above with respect to FIGS. 1 and 4 and determine if the output frequency of PLL 120 is changing at a rate greater than the maximum slew rate. If the rate of change is greater than the maximum slew rate (block 650—yes), slew rate limiter 640 will output a slew rate limited frequency (e.g., $\omega_1$ in FIG. 1) and PLL 130 will output a free running angle ramp (block 660).

However, if the slew rate is not greater than the threshold (block 650—no), slew rate limiter 140 generates a lock indication (block 670). PLL 130 receives the lock indication and uses the lock indication as an "active" signal. In this case, PLL 130 tracks the phase/angle information from PLL 120 (block 670). PLL 130 also outputs angle or phase information to an external system (block 680). For example, PLL 130 outputs the free running angle information in situations where the slew rate is above the threshold, or the tracked angle associated with the output from PLL 120, in situations where the slew rate is not above the threshold.

System 100 then determines whether the angle information output from PLL 120 and PLL 130 are "close" to each other, as described above with respect to FIG. 1 via compactor 150. Delay/accumulate block 160 also determines whether the outputs of PLL 120 and PLL 130 have been locked for a predetermined period of time and whether the input signal is above the lower limit for the predetermined period of time, as described above with respect to FIG. 1, and outputs this information (block 680). This information may be used by an external system, such as a UPS system, as described above. For example, the inverter of UPS system may be configured to follow the phase associated with the alternate power source when the input signal is above the predetermined level, the outputs of PLL 120 and 130 have been locked and both of these conditions have been true for a predetermined period of time. This helps ensure that if the UPS system switches to the alternate power source (e.g., a generator), that the phase of the alternate power source will be synchronized with the previously used standard input power source.

The foregoing description of exemplary implementations provides illustration and description, but is not intended to be exhaustive or to limit the embodiments described herein to the precise form disclosed. Modifications and variations are possible in light of the above teachings or may be acquired from practice of the embodiments.

For example, implementations described above refer to system 100 being used in conjunction with a UPS system. It should be understood that system 100 may be used with other types of systems in which PLLs are typically used.

In addition, various circuits associated with signal check and normalization block 110, PLLs 120 and 130, slew rate limiter 150, delay/accumulate block 160, etc., have been described. These circuits may be implemented via hardware (e.g., digital signal processors (DSPs), application specific integrated circuits (ASICs), field programmable gate arrays (FPGAs), microprocessors, other hardware elements, via software (e.g., instructions executed by a processor or microprocessor), or a combination of hardware and software. Further, the particular circuit implementations illustrated in FIGS. 1-5 are exemplary only. It should be understood that in other implementations, other configurations may be used.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above mentioned description is to be considered exemplary, rather than limiting, and the true scope of the invention is that defined in the following claims.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

What is claimed is:

1. A system, comprising:
a first phase-locked loop (PLL) circuit configured to:
receive an input signal,
generate a first output identifying a frequency associated with the input signal, and
generate a second output identifying phase information associated with the input signal;
a slew rate limiter coupled to the first PLL circuit and configured to:
receive the first output from the first PLL circuit,
determine whether the frequency of the first output is changing at greater than a predetermined rate, and
generate a first signal indicating whether the frequency is changing at greater than the predetermined rate; and
a second PLL circuit configured to:
receive the first signal from the slew rate limiter,
receive the second output from the first PLL circuit, and
generate an output signal identifying an angle or phase information based on the first signal and the second output.

2. The system of claim 1, wherein when generating an output signal, the second PLL circuit is configured to:
determine whether the frequency is changing at greater than the predetermined rate based on the first signal from the slew rate limiter, and
generate angle or phase information based on the phase information associated with the second output, in response to determining that the frequency is not changing at greater than the predetermined rate.

3. The system of claim 1, further comprising:
output logic configured to:
determine whether angle or phase output from the first PLL circuit and second PLL circuit are within a predetermined range of each other for a predetermined period of time, and
determine whether the input signal is above a predetermined level for the predetermined period of time.

4. The system of claim 3, wherein the output logic is further configured to:
forward information to an external device indicating whether angle or phase output from the first PLL circuit and second PLL circuit are within the predetermined range of each other for the predetermined period of time, and whether the input signal is above the predetermined level for the predetermined period of time.

5. The system of claim 4, wherein the second PLL circuit is configured to:
forward the output signal identifying the angle or phase information to a control device.

6. The system of claim 5, wherein the control device comprises an uninterruptible power supply (UPS) controller configured to synchronize the output of a UPS system with the output signal of the second PLL circuit in response to determining that the forwarded information indicates that the angle or phase output from the first PLL circuit and second PLL circuit are within the predetermined range of each other for the predetermined period of time, and that the input signal is above the predetermined level for the predetermined period of time.

7. The system of claim 6, wherein the UPS controller is configured to not synchronize the output of the UPS system with the output signal of the second PLL circuit in response to determining that the forwarded information indicates that the angle or phase output from the first PLL circuit and second PLL circuit are not within the predetermined range of each other for the predetermined period of time, or that the input signal is not above the predetermined level for the predetermined period of time.

8. The system of claim 1, further comprising:
signal check logic configured to determine whether the input signal is above a predetermined level.

9. The system of claim 8, wherein the signal check logic is further configured to normalize the input signal.

10. The system of claim 8, wherein the signal check logic is further configured to output an active signal in response to determining that the input signal is above the predetermined level.

11. The system of claim 10, wherein the first PLL circuit is further configured to:
receive the active signal, and
track the frequency associated with the input signal in response to receiving the active signal.

12. The system of claim 11, wherein the first PLL circuit is further configured to:
output a nominal frequency when the active signal indicates that the input signal is not above the predetermined level.

13. A method, comprising:
receiving an input signal;
determining whether the input signal is above a predetermined level;
generating, by a first phase-locked loop (PLL), a first output identifying a frequency associated with the input signal;
generating, by the first PLL, a second output identifying phase information associated with the input signal;
determining whether the frequency of the first output is changing at greater than a predetermined rate;
generating a lock signal indicating whether the frequency is changing at greater than the predetermined rate; and
generating, by a second PLL, an output signal identifying an angle or phase information based on the lock signal, in response to the lock signal indicating that the frequency is not changing at greater than the predetermined rate.

14. The method of claim 13, wherein the generating an output signal comprises:
generating the angle or phase information based on the phase information associated with the second output.

15. The method of claim 14, further comprising:
determining whether the angle or phase information output from the first PLL and second PLL are within a predetermined range of each other for a predetermined period of time; and
determining whether the input signal is above the predetermined level for the predetermined period of time.

16. The method of claim 15, further comprising:
forwarding information to a controller indicating whether the angle or phase information output from the first PLL and second PLL are within the predetermined range of each other for the predetermined period of time, and whether the input signal is above the predetermined level for the predetermined period of time.

17. The method of claim 16, further comprising:
forwarding the output signal identifying the angle or phase information to the controller.

18. The method of claim 17, further comprising:
synchronizing, by the controller, an output associated with the controller in response to determining that the angle or phase information output from the first PLL and second PLL are within the predetermined range of each other for the predetermined period of time, and that the input signal is above the predetermined level for the predetermined period of time.

19. A system, comprising:
input logic configured to receive an input signal and generate a first signal indicating whether the input signal is above a predetermined level;
a first phase-locked loop (PLL) circuit configured to:
receive the first signal,
generate a first output identifying a frequency associated with the input signal, and
generate a second output identifying an angle or phase information associated with the input signal;
control logic configured to:
receive the first output from the first PLL circuit,
determine whether the frequency of the first output is changing at greater than a predetermined rate, and
generate a second signal in response to determining that the frequency of the first output is not changing at greater than the predetermined rate; and
a second PLL circuit configured to:
receive the second output from the first PLL circuit,
receive the second signal from the control logic, and
generate an output signal identifying a second angle or phase information based on the second output from the first PLL circuit and in response to receiving the second signal from the control logic.

20. The system of claim 19, wherein the second PLL circuit is further configured to:
forward the output signal to a control device.

* * * * *